United States Patent
Hakoi et al.

(10) Patent No.: US 8,593,602 B2
(45) Date of Patent: Nov. 26, 2013

(54) PRODUCTION METHOD FOR LIQUID CRYSTAL DISPLAY DEVICE AND EXPOSURE DEVICE INCLUDING EXPOSURE OF ALIGNMENT LAYERS

(75) Inventors: Hiroyuki Hakoi, Nara (JP); Koichi Miyachi, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 1261 days.

(21) Appl. No.: 12/298,577

(22) PCT Filed: Apr. 12, 2007

(86) PCT No.: PCT/JP2007/058099
§ 371 (c)(1),
(2), (4) Date: Oct. 27, 2008

(87) PCT Pub. No.: WO2007/125758
PCT Pub. Date: Nov. 8, 2007

(65) Prior Publication Data
US 2009/0256086 A1    Oct. 15, 2009

(30) Foreign Application Priority Data

Apr. 27, 2006  (JP) ................. 2006-124426

(51) Int. Cl.
*G02F 1/1337* (2006.01)
*G02F 1/13* (2006.01)

(52) U.S. Cl.
USPC ............ 349/124; 349/123; 349/129; 349/187

(58) Field of Classification Search
USPC ................... 349/129, 123–124, 187
See application file for complete search history.

(56) References Cited

U.S. PATENT DOCUMENTS

| | | | |
|---|---|---|---|
| 5,557,436 A * | 9/1996 | Blose et al. | ............ 349/153 |
| 6,512,564 B1 | 1/2003 | Yoshida et al. | |
| 6,583,835 B1 | 6/2003 | Yoshida et al. | |

(Continued)

FOREIGN PATENT DOCUMENTS

| | | |
|---|---|---|
| JP | 5-335196 | 12/1993 |
| JP | 11-133429 | 5/1999 |

(Continued)

OTHER PUBLICATIONS

International Search Report for PCT/JP2007/058099, mailed Jul. 3, 2007.

*Primary Examiner* — Lauren Nguyen
(74) *Attorney, Agent, or Firm* — Nixon & Vanderhye P.C.

(57) ABSTRACT

The present invention provides a production method of a liquid crystal display device, and an exposure device, which can inhibit the deterioration of display quality even when the aligning treatment of an alignment layer is performed using an optical alignment method. The present invention pertains to a production method of a liquid crystal display device in which an alignment layer is provided on a substrate and two or more domains are formed in each pixel of a display region by exposing the alignment layer, wherein the production method includes the exposure step of exposing the alignment layer through a photo mask in which a plurality of light-transmitting areas are located in a stripe pattern, and wherein the exposure step is a step of exposing the alignment layer continuously while the relative position of the photo mask with respect to the substrate is moved at the time of viewing a substrate surface from the front in substantially parallel with the light-transmitting area.

6 Claims, 6 Drawing Sheets

(56) References Cited

U.S. PATENT DOCUMENTS

| | | |
|---|---|---|
| 6,781,656 B2 | 8/2004 | Yoshida et al. |
| 7,133,099 B2 | 11/2006 | Yoshida et al. |
| 2003/0202143 A1* | 10/2003 | Yoshida et al. ............... 349/123 |
| 2004/0227883 A1* | 11/2004 | Lee et al. ...................... 349/129 |
| 2007/0024784 A1 | 2/2007 | Yoshida et al. |
| 2007/0273818 A1 | 11/2007 | Yoshida et al. |
| 2008/0246933 A1* | 10/2008 | Uchikawa ...................... 355/52 |

FOREIGN PATENT DOCUMENTS

| | | | | |
|---|---|---|---|---|
| JP | 2001-108994 | 4/2001 | | |
| JP | 2002-350858 | 12/2002 | | |
| JP | 2003-66405 | 3/2003 | | |
| JP | 2005-24649 | 1/2005 | | |
| JP | 2005-148442 | 6/2005 | | |
| WO | WO-2005-078774 | * | 8/2005 | ........................ 21/27 |

* cited by examiner (a)　　　　　　　　　(b)

(a)

(b)

(a)

(b)

(a)

(b)

1st shot for the TFT substrate
2nd shot for the CF substrate
2nd shot for the TFT substrate
1st shot for the CF substrate

PRODUCTION METHOD FOR LIQUID CRYSTAL DISPLAY DEVICE AND EXPOSURE DEVICE INCLUDING EXPOSURE OF ALIGNMENT LAYERS

This application is the U.S. national phase of International Application No. PCT/JP2007/058099, filed 12 Apr. 2007, which designated the U.S. and claims priority to Japan Application No. 2006-124426, filed 27 Apr. 2006, the entire contents of each of which are hereby incorporated by reference.

TECHNICAL FIELD

The present invention relates to a production method of a liquid crystal display device and an exposure device. More specifically, the present invention relates to a production method of a matrix type liquid crystal display device which can realize a wide viewing angle by forming two or more domains in a pixel and an exposure device suitable for exposing alignment layers of such liquid crystal display devices.

BACKGROUND ART

The liquid crystal display device is widely used in television set, monitor for personal computer and the like because it is a display device of low power consumption and can be lightened and realize a low-profile device. However, the liquid crystal display device has an angle dependency of light transmittance since the polarization of light is usually controlled by a tilt angle of a liquid crystal molecule depending on an applied voltage. Consequently, in some directions of viewing angle, deterioration of a contrast ratio or a gray scale inversion at the time of gradation display occurs. Therefore, there was a room for contrivance in that the liquid crystal display device is generally insufficient for a viewing angle characteristic.

Technology of a domain division, in which a pixel is divided into two or more regions as well as alignment and tilt directions of liquid crystal molecules vary from region to region in the pixel, is developed. Thereby, since liquid crystal molecules are tilted in different directions in the pixel through an application of a voltage to a liquid crystal layer, it becomes possible to improve the viewing angle characteristic of the liquid crystal display device. Each region, in which alignment and tilt directions of liquid crystal molecules are different from each other, is also called a domain, and the domain division is also called a multi domain.

Examples of a liquid crystal mode of a horizontal alignment mode, in which the domain division is performed, include a multi domain twisted nematic (TN) mode, a multi domain electrically controlled birefringence (ECB) mode, a multi domain optically compensated birefringence (OCB) mode, and the like. On the other hand, examples of a liquid crystal mode of a vertical alignment mode include a multi domain vertical alignment (MVA) mode, a patterned vertical alignment (PVA) mode, and the like, and various improvements for realizing a wider viewing angle are made to the liquid crystal display devices of various mode. Among others, a multi domain vertical alignment twisted nematic (VATN) mode is known as a liquid crystal mode which can realize a wide viewing angle and a fast response with a few number of processing. In the VATN mode, the liquid crystal molecule has a twisted structure by using vertical alignment layers in which directions of an aligning treatment on both substrates are substantially perpendicular to each other, and liquid crystal display device has a plurality of domains, in which directions of the alignment of the liquid crystal molecules are different from one another in one pixel.

Examples of a method of performing the domain division include a rubbing method and an optical alignment method. As the rubbing method, a method in which the domain division is performed by rubbing in a state of separating each pixel (subpixel) of a display region into a rubbing region and non-rubbing region by patterning with a resist is proposed. However, there was a room for contrivance in that since the alignment treatment is performed by rubbing the surface of an alignment layer with a cloth wound around a roller in the rubbing method, defects such as a fluey of the cloth, dust such as shavings, break of a switching device due to static electricity, a characteristic shift and degradation are generated. Further, there might be cases where rubbing was not sufficient at an edge portion of the resist.

On the other hand, an optical alignment method is an alignment method in which an optical alignment layer is formed by use of an optical alignment material and an alignment anchoring force is generated in the alignment layer by irradiating light such as ultraviolet light to the optical alignment layer. In accordance with the optical alignment method, generation of dirt and dust can be inhibited since an aligning treatment of an alignment layer can be performed in a non-contact manner. Further, since light can be irradiated to each region within a surface of the alignment layer under different conditions by using a photo mask at the time of exposing, a domain having a desired design can be readily formed.

As a conventional method of a domain division by an optical alignment method, for example, patent document 1 is disclosed. In patent document 1, a technology, in which a domain is formed by performing a first ultraviolet irradiation to an alignment layer by using a photo mask having light-transmitting areas and light-blocking areas, respectively, located in a stripe pattern, then shifting a position of the photo mask by half of a pitch of the stripe, i.e., by a width of the stripe, in a direction perpendicular to a direction of an orientation of the stripe, and performing a second ultraviolet irradiation from the direction opposite to the direction of the first ultraviolet irradiation, is disclosed. If the optical alignment method is thus used, the pixel (subpixel) can be readily divided into two or more domains by using a photo mask.

However, in an exposure system using a photo mask in the optical alignment method, alignment irregularities are generated in the alignment layer when dust adheres to the vicinity of a light-transmitting area of a photo mask. Then, there was a room for contrivance in that when white display is provided, a region in which alignment irregularities is recognized as a black point and therefore this causes the deterioration of display quality. Further, the optical alignment method is applied to the VATN mode (hereinafter, also referred to as a "4 VATN mode") in which four domains are formed, the deterioration of display quality due to the influence of alignment irregularity has particularly remarkably occurred.

In association with such problems, a technology of reducing pinholes generated by contaminants on a photo mask at the time of exposing a negative photosensitive resin is disclosed (for example, see patent document 2). However, this technology is a technology concerning a method of exposing the negative photosensitive resin and is not a technology concerning the alignment layer of the liquid crystal display device, and thought of performing the domain division by using the optical alignment method is not disclosed at all.

Further, presently, an exposure device for performing a domain division by an optical alignment method is little-disclosed, and further, naturally, an exposure device which can inhibit the deterioration of display quality of a liquid crystal display device due to the dust adhering to a photo mask, is not also disclosed.

Patent Document 1: Japanese Kokai Publication Hei-11-133429

Patent Document 2: Japanese Kokai Publication Hei-5-335196

DISCLOSURE OF THE INVENTION

Problems to be Solved by the Invention

In view of the above state of the art, it is an object of the present invention to provide a method of producing a liquid crystal display device, and an exposure device, which can inhibit the deterioration of display quality even when the aligning treatment of an alignment layer is performed using an optical alignment method.

Means for Solving the Problems

The present inventors made various investigations concerning a method of producing a liquid crystal display device, and an exposure device, which can inhibit the deterioration of display quality due to the influence of dust adhering to a photo mask, and consequently have noted exposure aspects of the alignment layer. Then, they found that when dust 26 adheres to the vicinity of a light-transmitting area 24 of a photo mask 23 as shown in FIG. 9, conventionally, since light to an area to which the dust 26 adheres is blocked, the part of the alignment layer corresponding to the part of the dust 26 which protrudes into the light-transmitting area 24 becomes an unexposed region 30 and does not undergo an aligning treatment to generate an alignment irregularity, and consequently the alignment irregularity becomes a black point to cause the deterioration of display quality. Further, they found that in such a case, if exposing two regions in a pixel 32 twice by using the same photo mask as shown in FIG. 10, the unexposed region 30 is largely formed in one pixel 32 and this further adversely affects the display quality, and they found that the deterioration of display quality can be inhibited in the liquid crystal display device undergoing an aligning treatment by use of the optical alignment method and the above problems can be solved by performing an exposure step by using at least one aspect of an aspect that the alignment layer is exposed while the relative position of the photo mask with respect to the substrate is moved, an aspect that after the relative position of the photo mask with respect to the substrate is moved, the same domain is exposed more than once, and an aspect that after the relative position of the photo mask with respect to the substrate is moved by a pixel pitch or longer, different domains are exposed more than once. These findings have now led to completion of the present invention.

That is, the present invention pertains to a production method of a liquid crystal display device (hereinafter, also referred to as a "first production method of the present invention") in which an alignment layer is provided on a substrate and two or more domains are formed in each pixel of a display region by exposing the alignment layer, wherein the production method includes an exposure step of exposing the alignment layer through a photo mask in which a plurality of light-transmitting areas are located in a stripe pattern and wherein the exposure step is a step of exposing the alignment layer continuously while the relative position of the photo mask with respect to the substrate at the time of viewing a substrate surface from the front is moved in a longitudinal direction of the light-transmitting area.

The present invention also pertains to a production method of a liquid crystal display device (hereinafter, also referred to as a "second production method of the present invention") in which an alignment layer is provided on a substrate and two or more domains are formed in each pixel of a display region by exposing the alignment layer, wherein the production method includes the exposure step of exposing the alignment layer through a photo mask in which a plurality of light-transmitting areas and a plurality of light-blocking areas are located, and wherein the exposure step has the first stationary exposure step of exposing the alignment layer in a state of fixing a relative position of the photo mask with respect to the substrate, a moving step of moving while a relative position of the photo mask with respect to the substrate at the time of viewing a substrate surface from the front is fixed, and a second stationary exposure step of exposing a domain which has been irradiated in the first stationary exposure step while the relative position of the photo mask with respect to the substrate is fixed.

The present invention further pertains to a production method of a liquid crystal display device (hereinafter, also referred to as a "third production method of the present invention") in which an alignment layer is provided on a substrate and two or more domains are formed in each pixel of a display region by exposing the alignment layer, wherein the production method includes an exposure step of exposing the alignment layer through a photo mask in which a plurality of light-transmitting areas and a plurality of light-blocking areas are located, and wherein the exposure step has a first stationary exposure step of exposing the alignment layer while a relative position of the photo mask with respect to the substrate is fixed, a moving step of moving the with respect of the photo mask to the substrate by at least a pixel pitch, and a second stationary exposure step of exposing a domain different from a domain which has been irradiated in the first stationary exposure step while a relative position of the photo mask with respect to the substrate is fixed.

Hereinafter, the present invention will be described in detail.

A liquid crystal display device produced by the production method of a liquid crystal display device of the present invention is a liquid crystal display device in which an alignment layer is provided on a substrate and two or more domains are formed in each pixel of a display region by exposing the alignment layer. That is, the liquid crystal display device produced according to the present invention has two or more domains, formed by the domain division by using the optical alignment method, in each pixel of the display region. Accordingly, in accordance with the present invention, a liquid crystal display device having an excellent viewing angle characteristic can be produced. Herein, a display region is a region to display images, in which the pixels are generally located. Further, "two or more domains are formed in each pixel of a display region" does not requires that two or more domains are formed in all each pixel of a display region in the strict sense and substantially all pixels to be used for display have only to have two or more domains, respectively. Furthermore, the liquid crystal display device produced by the production method of a liquid crystal display device of the present invention may have a pair of substrates opposed to each other and alignment layers provided on the opposed surfaces of the pair of substrates and may be a liquid crystal display device in which two or more domains are formed in each pixel of a display region by exposing the alignment layer.

With respect to the constituents of the liquid crystal display device produced by the production method of a liquid crystal display device of the present invention, other components other than standard components of such liquid crystal display device is not particularly limited as long as the liquid crystal display device essentially includes standard components.

The first production method of the present invention includes an exposure step of exposing an alignment layer through a photo mask in which a plurality of light-transmitting areas is located in a stripe pattern as an aligning treatment step using an optical alignment method. Thereby, since the exposure can be collectively performed to a plurality of pixels usually arrayed in a matrix pattern, the alignment layer can be subjected to an aligning treatment efficiently. Herein, "the light-transmitting areas are located in a stripe pattern" means, more specifically, that the light-transmitting area and the light-blocking area whose shapes in viewing the photo mask from the front (main surface) are approximately rectangular, respectively, are preferably located repeatedly. Further, pitches of the plurality of the light-transmitting areas are not particularly limited, but the plurality of the light-transmitting areas is preferably located with the same pitch from the viewpoint of exposing the pixels collectively. Furthermore, the first production method of the present invention may include an exposure step of exposing an alignment layer through a photo mask in which a plurality of light-transmitting areas are located in a stripe pattern in a light-blocking region as an aligning treatment step using an optical alignment method.

The second and the third production methods of the present invention include an exposure step of exposing an alignment layer through a photo mask in which a plurality of light-transmitting areas and a plurality of light-blocking areas are located as an aligning treatment step using an optical alignment method. Thereby, the alignment layer can be subjected to an aligning treatment efficiently as with the first production method of the present invention. The pattern of the plurality of light-transmitting areas to be located in the second and the third production methods of the present invention is not particularly limited, and examples of the pattern include a pattern in which the light-transmitting areas are located in a stripe pattern described above, a pattern in which the light-transmitting areas are located in a mosaic pattern, and a pattern in which the light-transmitting areas are located in a delta pattern. Further, the second and the third production methods of the present invention may include an exposure step of exposing an alignment layer through a photo mask in which a plurality of light-transmitting areas is located in a light-blocking region as an aligning treatment step using an optical alignment method.

In the first production method of the present invention, (1) the exposure step takes an aspect of exposing the alignment layer continuously while the relative position of the photo mask with respect to the substrate at the time of viewing a substrate surface from the front is moved in the longitudinal direction of the light-transmitting area. Further, in the second production method of the present invention, (2) the exposure step takes an aspect having the first stationary exposure step of exposing an alignment layer while a relative position of the photo mask with respect to the substrate is fixed, the moving step of moving the relative position of the photo mask with respect to the substrate at the time of viewing a substrate surface from the front, and the second stationary exposure step of exposing a domain has been irradiated (exposed) in the first stationary exposure step while a relative position of the photo mask with respect to the substrate is fixed. Furthermore, in the third production method of the present invention, (3) the exposure step takes an aspect having the first stationary exposure step of exposing an alignment layer while a relative position of the photo mask with respect to the substrate is fixed, the moving step of moving the relative position of the photo mask with respect to the substrate by at least a pixel pitch, and the second stationary exposure step of exposing a different domain from the domain irradiated (exposed) in the first stationary exposure step while a relative position of the photo mask with respect to the substrate is fixed. In the present description, a pixel pitch (subpixel pitch) refers to a distance between two points corresponding to each other in two adjacent pixels (subpixels).

In accordance with the aspects (1) and (2), even when dust adheres to the photo mask, the generation of an unexposed region (non-aligning treatment region) due to the transfer of dust in a region to be exposed in the alignment layer can be inhibited since it is possible to expose an alignment layer (to perform an aligning treatment of an alignment layer) while dust is moved or after dust is moved in the same domain. Therefore, the deterioration of display quality resulting from alignment irregularities in the unexposed region can be inhibited. The region exposed while dust is moved or after dust is moved becomes a less-exposed region (a region of a low exposure) compared with a normal region without an influence of dust. However, even in the region of a low exposure, since necessity minimum exposure is usually performed, an effect of inhibiting the deterioration of display quality can be exerted.

Further, in accordance with the aspect of the above (3), even when dust adheres to the photo mask, it is possible to inhibit generation of an unexposed region (non-aligning treatment region) due to the transfer of dust in one pixel since the dust is moved to a different pixel between a first exposure (the first stationary exposure) and a second exposure (the second stationary exposure). Therefore, an area of the unexposed region generated in the pixel which is the smallest unit of liquid crystal display (image display) can be reduced, and consequently the deterioration of display quality can be inhibited.

Thus, in accordance with the first, the second and the third production methods of the present invention, it is possible to achieve an effect of inhibiting the deterioration of display quality, respectively, even though an alignment layer susceptible to exposure unevenness is subjected to the aligning treatment by an optical alignment method. Accordingly, it is preferable to implement the present invention in combination of the aspects (1) to (3). However, when the aspect (1) is combined with the second and the third production methods of the present invention, light-transmitting areas of photo masks in the second and the third production methods of the present invention are preferably located in a stripe pattern as with the first production method of the present invention.

In the aspects (1) to (3), it is preferable to move the relative position of the photo mask with respect to the substrate, more specifically, to move the photo mask and/or the substrate in such a way that the relative position between the substrate and the photo mask is changed. Thus, in the aspects (1) to (3), it is possible to appropriately select any one of an aspect of moving only the photo mask, an aspect of moving only the substrate, and an aspect of moving the photo mask and the substrate. However, in the aspect (1), an aspect of exposing the alignment layer while the photo mask and the substrate are similarly moved (at the same speed in the same direction) does not constitute the present invention because this aspect does not exhibit an effect of the present invention.

Further, in the aspect (1), to move something in the longitudinal direction of the light-transmitting area may be to move something in the stripe direction of the light-transmitting area, and it is generally preferable to move something in a direction approximately parallel to a long side direction of the light-transmitting area whose planar shape is approximately a rectangle. By moving the photo mask along a stripe pattern light-transmitting area in this manner, moving of the photo mask during exposing the alignment layer does not cause a region to be exposed to change in a pixel and the same region (a region being the same domain) can be exposed. The planar shape of the light-transmitting area is a shape at the time of viewing the photo mask from the front (main surface). Further, in the aspect (1), the planar shape of the light-transmitting area is not particularly limited as long as two sides in a longitudinal direction in a region overlapping a display region to be exposed are approximately parallel to each other, and examples of the planar shape include approximately a rectangle, approximately a parallelogram, approximately a rectangle whose corners are rounded, and shapes which combined these shapes. Furthermore, in the aspects (2) and (3), examples of the state of fixing a relative position of the photo mask with respect to the substrate include, more specifically, a state of resting the substrate and the photo mask together, and a state of moving the photo mask and the substrate similarly (at the same speed in the same direction), and among others, a state of resting the substrate and the photo mask together is preferable.

In the aspects (1) to (3), the photo mask may be located in a state of being inclined relative to the substrate, but from the viewpoint of maintaining an approximately uniform proximity gap, it is preferable to locate the photo mask so as to be approximately parallel to the substrate. That is, it is preferable to locate the photo mask so as to have a uniform distance between the substrate and the photo mask. Further, in the aspects (1) to (3), from the similar viewpoint, it is preferable that the substrate and the photo mask be located so as to be approximately parallel to each other and the relative position of the photo mask with respect to the substrate are moved without changing a distance between the substrate and the photo mask, and that the photo mask is located so as to have a uniform distance between the substrate and the photo mask and the relative position of the photo mask with respect to the substrate is moved without changing a distance between the substrate and the photo mask. In the forms (2) to (3), a direction in which the relative position of the photo mask with respect to the substrate is moved is not particularly limited, and it may be appropriately set.

As described above, the aspect (1) may be an aspect in which the photo mask is moved in the longitudinal direction of the light-transmitting area while the alignment layer is exposed in such a way that the relative position of the photo mask with respect to the substrate at the time of viewing a substrate surface from the front is changed.

The liquid crystal display device produced according to the present invention may be color display or black and white display as long as it is a matrix type liquid crystal display device.

When the liquid crystal display is color display, each pixel in the display region is usually composed of a plurality of subpixels in which filters with colors different from one another are located. Accordingly, when the present invention is applied to the production method of a liquid crystal display device of color display, the pixel may be construed as a subpixel.

The first, the second and the third production methods of the present invention include the above-mentioned steps, respectively, as an essential step, and other steps are not particularly limited.

Preferable aspects in the first, the second and the third production methods of the present invention will be described in detail below.

In the aspect (1), as for the exposure step, it is preferable to expose the alignment layer while the relative position of the photo mask with respect to the substrate is moved in one direction. Thereby, the alignment layer can be exposed while the position of dust is moved without duplication of the position, and therefore the deterioration of display quality can be more inhibited.

In the photo mask of the aspect (1), it is preferable that a length in the longitudinal direction of the light-transmitting area be longer than a length of a display region to be exposed at the time of exposure in a direction parallel to the longitudinal direction of the light-transmitting area. More specifically, in the photo mask of the aspect (1), it is preferable that a length in the longitudinal direction of the light-transmitting area is longer than a length of a display region to be exposed at the time of exposure in a direction parallel to the longitudinal direction of the light-transmitting area. Thereby, an alignment layer can be exposed through the light-transmitting area continuously in a display region to be exposed during moving the photo mask and/or the substrate. The extent of the length in the longitudinal direction of the light-transmitting area is not particularly limited, and it may be appropriately set in accordance with an amount of change in a relative position of the photo mask with respect to the substrate In the exposure step of the aspect (1), it is preferable to expose the alignment layer while the photo mask and/or the substrate are/is moved at a constant speed, and it is more preferable to expose the alignment layer while the photo mask or the substrate is moved at a constant speed. Thereby, a deviation of the substrate and a deflection of the photo mask due to changes in speed can be effectively inhibited, and therefore the occurrence of alignment deviation of the photo mask can be inhibited. Thus, in the aspect (1), the exposure step may be an aspect of moving the photo mask and/or the substrate at a constant speed while the alignment layer is exposed, or may be an aspect of moving the photo mask or the substrate at a constant speed while the alignment layer is exposed.

In the photo mask of the aspect (2), it is preferable that a size of a light-transmitting area-located region on a side opposite to a moving direction of the photo mask is larger than a size of a display region to be exposed at the time of exposure. By thus providing a margin for the light-transmitting area of the photo mask, an alignment layer can be expose through the light-transmitting area continuously in a display region to be exposed even if moving the photo mask and/or the substrate. A light-transmitting area-located region is usually a region which all light-transmitting areas located in the photo mask cover. Thus, in the photo mask of the aspect (2), a size of a region in which the light-transmitting area is located may be larger than a size of a display region to be exposed at the time of exposure on the side opposite to a direction in which the photo mask is moved.

In the aspect (2), (2-1) the exposure step preferably takes an aspect in which a stationary exposure step and the moving step are alternately performed repeatedly. By increasing the number of times of moving dust more than twice like this, it is possible to bring an exposure amount in a region (region of low exposure) in which an exposure amount for the alignment layer is small compared with an exposure amount in a normal region of the alignment layer unaffected by dust close to the exposure amount in the normal region, and therefore the deterioration of display quality can be further inhibited. That the stationary exposure step and the moving step are alternately performed repeatedly means, more specifically, that after the first stationary exposure step, the moving step, and the second stationary exposure step are performed in this order, further the moving step and the stationary exposure step are performed repeatedly in this order, and this aspect is preferable. Further, in the stationary exposure step performed repeatedly, a common domain is exposed while a relative position of the photo mask with respect to the substrate is fixed. Furthermore, in the moving step performed repeatedly, a direction in which the photo mask is moved is not particularly limited, and it may be appropriately set.

Further, in the moving step of the aspect (2-1), it is preferable to move the photo mask and/or the substrate in such a way that a relative position of the photo mask with respect to the substrate in the stationary exposure step are different from one another. Thereby, since the alignment layer is exposed in a state in which the position of dust to the substrate is always changed, it is possible to bring the exposure amount in a region of low exposure close to that in the normal region.

In the exposure step of the aspect (2), the first stationary exposure step and the second stationary exposure step are preferably performed at the same exposure amount. Thereby, since the exposure amount can be kept constant among plural regions of low exposure, variations in alignment of liquid crystal molecule between regions of low exposure can be inhibited. The term same exposure amount does not require that the exposure amounts are the same in a strict sense, and this has only to have the same exposure amount which does not cause the alignment of liquid crystal molecule to vary between regions of low exposure. Further, in the aspect (2), the exposure step may take an aspect in which the first stationary exposure step and the second stationary exposure step are performed at the same exposure amount.

In the photo mask of the aspect (3), a size of a light-transmitting area-located region on a side opposite to a moving direction of the photomask is preferably larger than a size of a display region to be exposed at the time of exposure. By thus providing a margin for the light-transmitting area of the photo mask, an alignment layer can be exposed through the light-transmitting area continuously in a display region to be exposed even if moving the photo mask and/or the substrate. Thus, in the photo mask of the aspect (3), a size of a light-transmitting area-located region may be larger than a size of a display region to be exposed at the time of exposure on the side opposite to a direction in which the photo mask is moved.

In the aspect (3), (3-1) it is preferable that in the photo mask, the plurality of light-transmitting areas are located in a stripe pattern, and the plurality of light-transmitting areas have a pitch equal to a pixel pitch and a width of half of the pixel pitch in a direction perpendicular to the light-transmitting area at the time of exposure, and in the moving step, the photomask moves by (N+0.5) pixel pitches in a direction perpendicular to the light-transmitting area, taking N as a natural number. Thereby, two domains can be formed efficiently in each pixel of a display region by exposing the alignment layer twice. In the present description, a width of the light-transmitting area is a length of the light-transmitting area in a direction perpendicular to the longitudinal direction (direction of a short side) of the stripe pattern light-transmitting area. A pitch of the light-transmitting area refers to a distance between two points corresponding to each other in two adjacent light-transmitting areas. Thus, in the aspect (3), with respect to the photo mask, a plurality of light-transmitting areas is located in a stripe pattern, and a pitch of the light-transmitting area is set at the same length equal to a pixel pitch in a direction of a short side of the light-transmitting area at the time of exposure, and a width in a direction of a short side of the light-transmitting area is set at a length of half of the pixel pitch in a direction of a short side of the light-transmitting area at the time of exposure, and the moving step may be an aspect in which taking N as a natural number, the relative position of the photo mask with respect to the substrate is moved in a direction of a short side of the light-transmitting area by (N+0.5) pixel pitches in a direction of a short side of the light-transmitting area at the time of exposure. That the light-transmitting area has a pitch equal to a pixel pitch does not require that the light-transmitting area has the same pitch as the pixel pitch in a strict sense, and the light-transmitting area has only to have the similarity to the pixel pitch by which domains having a similar form to extent not recognized as display irregularity in a display region surface can be formed in each pixel. Further, that the light-transmitting area has a width of half of the pixel pitch does not require that the light-transmitting area has a width of half of the pixel pitch in a strict sense, and the light-transmitting area has only to have a width similar to half of the pixel pitch by which an unexposed region is not produced in a pixel opening through which light in the pixel passes. Further, in the aspect (3), with respect to the photo mask, a plurality of light-transmitting areas is located in a stripe pattern, and the moving step takes an aspect in which the relative position of the photo mask with respect to the substrate is moved in a direction of a short side of the light-transmitting area by the pixel pitch or longer in a direction of a short side of the light-transmitting area at the time of exposure.

In the photo mask of the aspect (3-1), the number of the plurality of light-transmitting areas is preferably larger than the number of the pixels in a direction perpendicular to the light-transmitting area at the time of exposure by N or more, and the number of the plurality of light-transmitting areas is more preferably larger than number of the pixels in a direction perpendicular to the light-transmitting area at the time of exposure by N. Thereby, in the aspect (3-1), an alignment layer can be exposed through the light-transmitting area continuously in a display region to be exposed even if moving the photo mask and/or the substrate.

In the first, the second and the third production methods of the present invention, in the exposure step, it is preferable that the display region is divided into two or more in each of the two or more exposure regions and the alignment layer is exposed through the photo mask. Thereby, in the case of subjecting a substrate of large size such as a 65-inch substrate to an aligning treatment, an aligning treatment can be performed throughout the display region without increasing the size of a photo mask or an exposure device. Thus, in the first, the second and the third production methods of the present invention, the exposure step may be an aspect in which an alignment layer surface is divided into two or more exposure regions and an exposure of the alignment layer is performed through a photo mask for every divided exposure region.

A liquid crystal mode of the liquid crystal display device produced by the first, the second and the third production methods of the present invention is not particularly limited, but it is preferably a 4 VATN mode. That is, in the production method of a liquid crystal display device of the present invention, it is preferable that the production method includes the steps of: forming two domains partitioned in a stripe pattern in the pixel of the display region by exposing the alignment layer twice in each pixel in directions parallel to and opposite to each other over a plurality of the pixels in one substrate through a photo mask, the photo mask including the plurality of light-transmitting areas located in a stripe pattern; forming two domains partitioned in a stripe pattern in the pixel of the display region by exposing the alignment layer twice in each pixel in directions parallel to and opposite to each other over a plurality of the pixels in the other substrate through a photo mask, the photo mask including the plurality of light-transmitting areas located in a stripe pattern; bonding the one substrate to the other substrate in such a way that the direction of exposure for the one substrate is perpendicular to the direction of exposure for the other substrate and the alignment layer on the one substrate faces the alignment layer on the other substrate; and injecting liquid crystal molecules having negative dielectric anisotropy between the substrates, wherein the liquid crystal molecules are aligned substantially perpendicularly to surfaces of the alignment layers when a voltage less than a threshold value is applied between the substrates. As described above, the production method of a liquid crystal display device includes the step of forming two kinds of domains, in which directions of exposure (direction of light irradiation) are parallel to and opposite to each other, in a stripe pattern in each pixel and an alignment layer surface by exposing the alignment layers provided on both substrates by using the same or different photo masks in which light-transmitting areas are provided in a stripe pattern, the step of bonding one substrate to the other substrate in such a way that the directions of exposure (direction of light irradiation) of both substrates are perpendicular to each other in viewing the substrate from the front, and the step of injecting a nematic liquid crystal material having negative dielectric anisotropy between both substrates, wherein the alignment layers may cause the liquid crystal molecules near the surface of alignment layer to be aligned substantially perpendicularly to the surface of alignment layer when a voltage is not applied between the substrates. That the one substrate is bonded to the other substrate in such a way that the directions of exposure of both substrates are perpendicular to each other does not requires that the one substrate is bonded to the other substrate in such a way that the directions of exposure of both substrates are perpendicular to each other in a strict sense, but it is preferable that an angle which the direction of exposure (direction of light irradiation) to one substrate forms with the direction of exposure (direction of light irradiation) to the other substrate be substantially 90° in viewing the substrate from above. Further, that the liquid crystal molecules are aligned substantially perpendicularly to the surface of alignment layer preferably means, more specifically that the liquid crystal molecules near the surface of alignment layer are aligned to the surface of alignment layer in such a way that an angle, which a longitudinal direction of the liquid crystal molecule makes with the surface of alignment layer, is 85° or more and less than 90° from the viewpoint of increasing the transmittance in the 4 VATN mode.

Further, it is preferable that in the production method of a liquid crystal display device of the present invention, the liquid crystal display device includes a pair of substrates and a liquid crystal layer arranged between the substrates, the liquid crystal layer contains liquid crystal molecules having negative dielectric anisotropy, the alignment layers are each provided on a surface on the liquid crystal layer side of each the pair of substrates, and the liquid crystal molecules are aligned substantially perpendicularly to surfaces of the alignment layers when a voltage less than a threshold value is applied between the substrates, and the liquid crystal display device has four domains, and in the four domains, alignment directions of the liquid crystal molecules near the alignment layer provided on one substrate is perpendicularly to alignment directions of the liquid crystal molecules near the alignment layer provided on the other substrate at the time of viewing a substrate surface from the front, and when a voltage less than a threshold value is applied between the pair of substrates, alignment directions of the liquid crystal molecules at the center and near the center of the liquid crystal layer are different in such a way that the alignment directions are perpendicular to each other. In a liquid crystal display device of the 4 VATN mode, each domain is formed with extremely high definition, and alignment irregularity has a very large effect on display quality. Therefore, application of the production method of a liquid crystal display device of the present invention to the 4 VATN mode can achieve particularly outstanding effect. As described above, the liquid crystal display device may be a form in which the liquid crystal display device includes a pair of substrates and a liquid crystal layer arranged between the substrates, the liquid crystal layer contains a nematic liquid crystal molecule having negative dielectric anisotropy, the alignment layers are provided on the surfaces on the liquid crystal layer side of both substrates and the liquid crystal molecules are aligned substantially perpendicularly to the surface of alignment layer when a voltage is not applied between the substrates, and the liquid crystal display device has 4 domains in which in viewing a substrate surface (substrate main surface) from the front, alignment directions of the liquid crystal molecule near the alignment layer provided on one substrate and the liquid crystal molecule near the alignment layer provided on the other substrate are perpendicular to each other, and alignment directions of the liquid crystal molecules positioned at the center and near the center (more preferably at the center) of the 4 domains are perpendicular to one another in viewing a substrate surface (substrate main surface) from the front when a voltage of a threshold value or more is applied between the substrates. That the liquid crystal molecules are aligned substantially perpendicularly to the surface of alignment layer preferably means, more specifically, that the liquid crystal molecules near the surface of alignment layer are aligned to the surface of alignment layer in such a way that an angle, which a longitudinal direction of the liquid crystal molecule makes with the surface of alignment layer, is 85° or more and less than 90° from the viewpoint of increasing the transmittance in the 4 VATN mode. Further, that the alignment directions are perpendicular to each other does not requires that the alignment directions are perpendicular to each other in a strict sense, but it is preferable that the alignment directions cross substantially at 90° in viewing a substrate surface (substrate main surface) from the front.

The present invention pertains to an exposure device including a stage and a light source, a photo mask being located between the stage and the light source, wherein the exposure device includes moving means of changing a relative position of the photo mask with respect to the stage during exposure. In accordance with such exposure device of the present invention, since the stage on which the substrate is mounted and the photo mask can be appropriately moved, this is suitable as an exposure device in the production method of a liquid crystal display device of the present invention described above. Accordingly, the exposure device of the present invention is suitable for an exposure device for aligning treatment.

The exposure device of the present invention may include other components other than such components or may include no other components and is not particularly limited as long as it is formed including above-mentioned components.

Further, in the exposure device of the present invention, the moving means preferably moves the stage and/or the photo mask at a constant speed for a certain period of time. Thereby, a deviation of the substrate on the stage and a deflection of the photo mask due to changes in speed can be effectively inhibited, and therefore the occurrence of alignment deviation of the photo mask can be inhibited.

Effects of the Invention

In accordance with the method of producing a liquid crystal display device of the present invention, the deterioration of display quality can be inhibited even when the aligning treatment of an alignment layer is performed using an optical alignment method. Further, the exposure device of the present invention is suitable as an exposure device in the production method of a liquid crystal display device of the present invention. That is, the exposure device of the present invention can be suitably used for the method of producing a liquid crystal display device of the present invention.

BEST MODE FOR CARRYING OUT THE INVENTION

Hereinafter, the present invention will be described in more detail by way of embodiments with reference to drawings, but the present invention is not limited to these embodiments.

EMBODIMENTS

Embodiment 1

Hereinafter, Embodiment 1 of the production method of a liquid crystal display device and the exposure device of the present invention will be described by use of FIGS. 1 to 7. In the present embodiment, a 4 VATN mode is described as an example, but a liquid crystal mode is not particularly limited in the present embodiment as long as it is a mode which can be formed by use of the photo mask having a stripe pattern, and examples of the mode include a 2 VATN mode and a 2 VAECB (vertical alignment electrically controlled birefringence) mode in addition to the 4 VATN mode.

First, a pair of substrates, which is not yet provided with an alignment layer, is prepared by a common method. FIG. 5(*a*) is a schematic plan view of TFT array substrate which is a first substrate of Embodiment 1 and FIG. 5(*b*) is a schematic plane view of the CF substrate which is a second substrate of Embodiment 1. As one substrate, a TFT array substrate, in which a scanning signal line and a data signal line are located crosswise in a matrix pattern on an insulating substrate by way of an insulating film (not shown) therebetween, and a TFT is located at each intersecting point of both signal lines, and further an pixel electrode is located in a region partitioned by the scanning signal line and the data signal line by forming (1) a scanning signal line 15, (2) a thin film transistor (TFT) 11, (3) a data signal line 16 and (4) a pixel electrode 12 in turn on the insulating substrate (not shown) as shown in FIG. 5(*a*), is used.

On the other hand, as the other substrate, a color filter substrate (CF substrate), in which black matrixes (BM) are arranged in a matrix pattern on an insulating substrate and further color filters are arranged in regions partitioned by the BMs by forming (1) a BM 13, (2) a color filter 14, (3) a protective film (not shown) and (4) a transparent electrode film (not shown) in turn on the insulating substrate (not shown) as shown in FIG. 5(*b*), is used. The color filter 14 is composed of a red (R) filter 14R, a green (G) filter 14G and a blue (B) filter 14B.

Thus, in the liquid crystal display device of the present embodiment, since color display is performed by use of filters of three colors of RGB, one pixel is composed of three subpixels. Further, each region, in which a filter partitioned by a pixel electrode or a light-blocking member such as BM is located, becomes the subpixel, and a region, in which each pixel is located, becomes a display region.

As an insulating substrate, a substrate having an insulating surface may be employed, and examples of the insulating substrate include a glass substrate, a quartz substrate, a plastic substrate and the like, but among them, the glass substrate being low-cost is suitable. As materials of members composing the first substrate and the second substrate described above, materials, used usually, may be used.

Next, a solution containing an optical alignment material is applied to a TFT substrate and a CF substrate by a spin casting method, and the resulting TFT substrate and CF substrate are baked, for example, at 180° C. for 60 minutes to form an alignment layer of vertically aligned mode. The optical alignment material is not particularly limited, and examples of the material include resins containing a photosensitive group. More specific examples thereof include polyimides containing photosensitive groups such as a 4-chalcone group (the following chemical formula (1)), a 4'-chalcone group (the following chemical formula (2)), a coumarin group (the following chemical formula (3)), and a cinnamoyl group (the following chemical formula (4)). Polyimides containing photosensitive groups of the following chemical formulas (1) to (4) develop a crosslinking reaction (including a dimerization reaction), an isomerization reaction, and optical realignment by irradiating ultraviolet light. That is, the alignment layer in the present embodiment is an alignment layer formed from a material (optical alignment material) whose alignment anchoring force is changed by irradiation of light (exposure). The alignment layer in the present embodiment is preferably formed from an optical alignment material of an optically coupling type. In accordance with these materials, variations of a pretilt angle, which is induced in the alignment layer surface, can be effectively reduced compared with an optical alignment material of an optically decomposing type. On the other hand, an optically aligned layer is susceptible to exposure unevenness and control of the pretilt angle of the liquid crystal molecule is largely affected by this exposure unevenness. Photosensitive groups of the following chemical formulas (1) to (4) include a structure in which a substituent is coupled with a benzene ring. Further, a cinnamate group ($C_6H_5$—CH═CH—COO—), in which an oxygen atom is further coupled with a carbonyl group in the cinnamoyl group of the following chemical formula (4), has an advantage that synthesis is easy. Accordingly, as an optical alignment material, polyimide containing a cinnamate group is more preferable. The optical alignment material of an optically decomposing type develops a decomposing reaction by irradiation of light such as ultraviolet light. Further, a baking temperature, a baking time and a film thickness of the optical alignment layer are not particularly limited, and they may be appropriately set.

[formula 1]

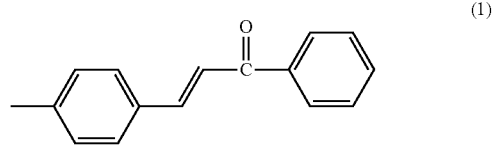

(1)

[formula 2]

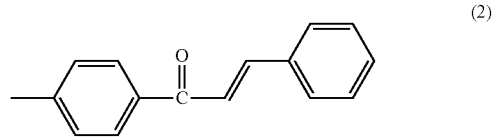

(2)

[formula 3]

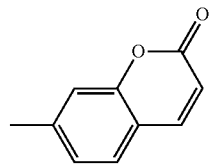

(3)

[formula 4]

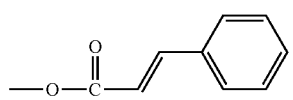

(4)

Next, a method of exposing a substrate will be described. First, an exposure device of the present embodiment will be described with reference to FIG. 1. FIG. 1 is a schematic perspective view of the exposure device in the present embodiment. As shown in FIG. 1, the exposure device 20 in the present embodiment is composed of a stage 21 for mounting a substrate 25 on, a light source part 22, and a photo mask 23 installed in a direction of light irradiation below the light source part 22. Thereby, the exposure device 20 can expose an alignment layer provided on the substrate surface collectively through the photo mask 23.

In the present embodiment, as shown in FIG. 1, a case where four display regions 27a, 27b, 27c, 27d are formed for one substrate and four liquid crystal display panels are prepared from one substrate (mother glass) will be described, and sizes of the substrate and the display region, the form of arrangement of the display region, and the number of display regions to be located may be appropriately designed.

The stage 21 is not particularly limited as long as the substrate can be mounted on the stage, but the stage to which the substrate can be fixed with a vacuum suction machine is preferable. Thereby, the substrate is not deviated even if the stage is moved, and therefore a deviation of mask alignment can be effectively inhibited.

The light source part 22 has a lamp, a polarizer and an optical lens. Thereby, the light source part 22 can emit collimated light beams 28 by appropriately refracting emitted light emitted from the lamp with an optical lens and therefore it is possible to determine (control) the exposure region to a desired size. Since the light source part 22 can irradiate polarized light, an aligning treatment of the alignment layer formed from the optical alignment material of an optically coupling type can be readily and adequately performed. Furthermore, a position of the light source part 22 and a direction of emission of the collimated light beams 28 can be appropriately changed, and light can be irradiated to the substrate 25 at a desired angle. In the present embodiment, as shown in FIG. 1, an exposure region is set in such a way that the display regions 27a, 27b, 27c, 27d can be just collectively exposed.

Examples of the lamp include a low-pressure mercury lamp, a deuterium lamp, a metal halide lamp, an argon resonance lamp, and xenon lamp. Laser such as excimer laser may be used in place of the lamp. A wavelength of the light may be appropriately set depending on the optical alignment material, but ultraviolet light is preferably used. A extinction ratio of the polarizer and species of the optical lens may be appropriately set.

The photo mask 23 has a stripe pattern in which the light-transmitting area through which light passes and the light-blocking area which blocks light are located repeatedly. Thereby, since the exposure can be performed to a plurality of pixels arrayed in a matrix pattern collectively, the alignment layer can be efficiently subjected to an aligning treatment. Widths of the light-transmitting area and the light-blocking area are set at a length of about half of the pixel pitch or the subpixel pitch. Thereby, in each substrate, the domain can be formed so as to bisect each subpixel. Furthermore, it is preferable to locate the photo mask 23 so as to be approximately parallel to the stage 21 from the viewpoint of maintaining an approximately uniform proximity gap which is a distance between the photo mask 23 and the substrate 25 rested on the stage 21 as shown in FIG. 1. The proximity gap may be appropriately set. As the photo mask 23, usually, a substance in which a pattern of metal such as chromium as a light-blocking area is formed on a transparent substrate such as a quartz substrate, or a substance in which an opening pattern as a light-transmitting area is formed on a metal plate can be used. Thus, a light-blocking area provided for the photo mask 23 may be a transparent region or may be an opening region.

The exposure device 20 has a moving means (not shown) which changes a relative position of the photo mask 23 with respect to the stage 21 during exposing. More specifically, the exposure device 20 can move the stage 21 and the photo mask 23 in arbitrary directions, respectively, for example, directions perpendicular to each other (in FIG. 1, the photo mask in the x-y direction, the stage in the X-Y direction) in a horizontal plane. Thereby, as described later, the deterioration of display quality due to the influence of dust on the photo mask can be inhibited because the substrate can be exposed with moving the photo mask. The moving means can move the stage 21 and the photo mask 23 at a constant speed for a certain period of time. Thereby, a deviation of the substrate on the stage and a deflection of the photo mask due to changes in speed can be effectively inhibited. The moving means is not particularly limited, and a roller connected to a power source such as an electric motor or the like may be used. In the exposure device 20, only the stage 21 may be moved, only the photo mask 23 may be moved, or the stage 21 and the photo mask 23 may be moved together.

Next, a method of exposing a TFT array substrate will be described with reference to FIG. 3. FIG. 3 is a schematic perspective view for illustrating an exposure aspect in Embodiment 1, and FIG. 3(a) is a view showing a state before exposure and FIG. 3(b) is a view showing a state of exposing. First, the TFT array substrate is mounted on a stage of the exposure device. In this time, as shown in FIG. 3, a light-transmitting area 24 having a width of about half of a subpixel pitch in a direction of a scanning signal line 15 is provided in the photo mask 23. As described above, the widths of the light-transmitting area 24 and the light-blocking area 29 may be set at about 85 μm for example, when a 32-inch type display device has a resolution of WXGA (1366×768 pixels) and a display region of 697.6845×392.256 mm, and a pixel is composed of three subpixels of RGB. Therefore, a plurality of light-transmitting areas 24 is located in such a way that each pitch of the light-transmitting area is equal to a subpixel pitch in a direction of the scanning signal line 15. Further, a length in the direction of a long side (longitudinal direction) of the light-transmitting area 24 is set at a length longer than that of a display region to be exposed at the time of exposure in a direction parallel to the long side of the light-transmitting area. Furthermore, it is assumed that in the photo mask 23, the dust 26 adheres to the vicinity of the light-transmitting area 24.

Subsequently, the photo mask 23 is positioned in such a way that each light-transmitting area 24 is aligned along a data signal line 16. More specifically, the photo mask 23 is positioned in such a way that one end of a short side of each light-transmitting area 24 is aligned with the data signal line 16 and one end of a long side of each light-transmitting area 24 is aligned with a perimeter of the display region. Thereafter, the movement of the photo mask 23 is started in the direction of the long side (the longitudinal direction) of the light-transmitting area 24, more specifically, in a direction parallel with the direction of the long side (the longitudinal direction) of the light-transmitting area 24 and in a direction to which one end of the light-transmitting area 24 aligned with the perimeter of the display region is moved away from the display region (a diagonally upward right direction on a drawing of FIG. 3), and a first exposure (first shot) is performed for a fixed time period for each subpixel of the display region in a state in which a speed of the photo mask 23 reaches a constant speed. Then, after the completion of the first shot for a fixed time period, the movement of the photo mask 23 is stopped. Thereby, an aligning treatment can be performed for half of a region of each subpixel and the alignment layer can be exposed while the position of dust 26 is moved. Therefore, it is possible to prevent an unexposed region from being generated due to the transfer of dust 26 in a region to be exposed by the first shot. Consequently, alignment irregularities generated in the unexposed region can be inhibited and the deterioration of display quality can be inhibited. In this time, a region (a region of a low exposure 31), in which an exposure amount is smaller than a normal exposure amount, is generated at a position corresponding to the dust 26, but alignment irregularities are not generated particularly remarkably in this region as described below.

Since the length in the direction of a long side of the light-transmitting area 24 is set at a length longer than that of a display region to be exposed at the time of exposure in a direction parallel to the long side of the light-transmitting area, the light-transmitting area 24 can perform the first shot continuously in a display region to be exposed during moving the photo mask. Further, from the same viewpoint, it is preferable that a length in the direction of a long side of the light-transmitting area 24 is set at a length longer than that of a display region to be exposed at the time of exposure in a direction parallel to the long side of the light-transmitting area by at least a length of a moving distance of the photo mask 23.

Here, a moving speed of the photo mask will be described with reference to FIG. 6. FIGS. 6(a) and 6(b) are conceptual views showing a change in the moving speed with time of the photo mask or the stage in the present embodiment. As shown in FIG. 6(a), the exposure device 22 preferably accelerates the speed of the photo mask and/or the stage at constant acceleration, moves the photo mask and/or the stage at a constant speed, and decelerates the speed of the photo mask and/or the stage at constant deceleration.

A moving speed of the photo mask will be described by use of an example in which the photo mask is moved like the present embodiment. It is preferable that as shown in FIG. 6(a), the exposure device 22 accelerates the photo mask at constant acceleration between time $t_0$ and time $t_1$, and a speed $v_1$ of the photo mask at this time varies according to $v_0+a_1t$ denoting an initial speed by $v_0$, an acceleration by $a_1$, and a time by t. In a duration between a time $t_1$ and a time $t_2$, it is preferable to move the photo mask at a constant speed, and a speed $v_2$ of the photo mask at this time has a constant value expressed by $v_0+a_1t_1$ since it is equal to the speed $v_1$ at time $t_1$. Furthermore, in a duration between a time $t_2$ and a time $t_3$, it is preferable to decelerate the photo mask at constant deceleration, and a speed $V_3$ of the photo mask at this time varies according to $v_0+a_1t_1+a_2t$ denoting an initial speed by $v_0+a_1t_1$, an acceleration by $a_2$, and a time by t. Herein, $a_1$ indicates a positive value and $a_2$ indicates a negative value. When both the photo mask and the substrate are moved, a relative speed between the photo mask and the substrate may be changed as described above.

Furthermore, as shown in FIG. 6(b), a moving speed of the photo mask will be described using specific values. Here, when $t_0=0$ sec, $t_1=2$ sec, $t_2=12$ sec, $t_3=14$ sec, $v_0=0$ mm/sec, $a_1=1$ mm/sec$^2$, and $a_2=-1$ mm/sec$^2$, a speed $v_1$ becomes $v_1=0+1\times t=t$ (mm/sec), and a speed $v_2$ becomes $v_2=0+1\times t_1=2$ (mm/sec), and a speed $V_3$ becomes $V_3=0+1\times 2-1\times t=2-t$ (mm/sec). In a duration between time $t_1=2$ sec and time $t_2=12$ sec during which the photo mask and/or the substrate are moved at a constant speed, for example, by exposing for 7 sec, the 1st shot can be carried out with inhibiting a deviation of the substrate on the stage and a deflection of the photo mask due to changes in speed effectively.

Here, a moving distance of the photo mask will be described. From the viewpoint of reducing the influence of dust adhering to the photo mask, basically, the larger the moving distance of the photo mask is more preferable. If the dust of 0.1 mm in diameter adheres to the mask and the photo mask or the substrate (stage) is moved by 1 mm during exposure, an exposure amount in a region of 1 mm in width in a distance by which the dust is moved becomes 90% of an exposure amount in a normal area. When the optical alignment material in the present embodiment is used, about 90% of a predetermined exposure amount is a sufficient amount and the display quality does not become a problem. When the photo mask or the substrate is moved by 2 mm, an exposure amount in a region which the dust is moved becomes 95% of a predetermined exposure amount. Of course, in the present embodiment, the moving distance of the photo mask or the substrate may be 1 mm or less, and the deterioration of display quality due to the dust can be inhibited.

Furthermore, the number of pixels contained in a range of the moving distance of the photo mask or the substrate in the present embodiment will be described with reference to Table 1. Table 1 is a table showing a relationship between the moving distance of the photo mask or the substrate and the number of pixels contained in a range of the moving distance. As shown in Table 1, in each case, when the moving distance of the photo mask (substrate) is 1 mm, the number of pixels contained in a range of the moving distance of the photo mask (substrate) becomes larger than 1. Therefore, it is understood that when the moving distance of the photo mask (substrate) is 1 mm or longer, even if the dust with a size of one pixel adheres, the dust is not transferred within one pixel and therefore the deterioration of display quality can be sufficiently inhibited. That is, it is understood that a relative position of the photo mask with respect to the substrate is preferably moved by 1 mm or longer in the present embodiment.

TABLE 1

| Size | Format | The number of pixels | Display region (mm) | Pixel size (RGB) (mm) | The number of pixels contained in a range of moving distance of mask (substrate) movement | | |
|---|---|---|---|---|---|---|---|
| | | | | | 1 mm | 10 mm | 20 mm |
| 32" | WXGA | 1366 × 768 | 697.6845 × 392.256 | 0.51 | 1.96 | 19.58 | 39.16 |
| 37" | WXGA | 1366 × 768 | 819.6 × 460.8 | 0.60 | 1.67 | 16.67 | 33.33 |
| 37" | HDTV | 1920 × 1080 | 819.6 × 460.8 | 0.43 | 2.34 | 23.44 | 46.87 |
| 45" | HDTV | 1920 × 1080 | 985.92 × 554.58 | 0.51 | 1.95 | 19.47 | 38.95 |
| 65" | HDTV | 1920 × 1080 | 1428.4 × 803.52 | 0.74 | 1.34 | 13.44 | 26.88 |

Hereinafter, the method of exposing a substrate will be described again. After the completion of the first shot, the photo mask is horizontally moved by about half of the subpixel pitch in a direction of a scanning signal line to align the light-transmitting area as with the first shot, and then a second exposure (second shot) is performed for a certain time period for the rest half of a region of each subpixel while the photo mask is moved at a constant speed. Thereby, the generation of an unexposed region due to the dust in a region to be exposed by the second shot can be also inhibited at the time of the second shot.

In this time, the exposure of the second shot is performed from the direction parallel to and opposite to the direction of the first shot. That is, the 2nd shot is carried out in such a way that an incident angle of light relative to the substrate in the 2nd shot is approximately equal to an incident angle of light relative to the substrate in the 1st shot and the inclination of light (direction of light irradiation) relative to the substrate in the 1st shot in viewing the substrate from above is opposite to the inclination of light (direction of light irradiation) relative to the substrate in the 2nd shot in viewing the substrate from above. Thereby, two domains (exposed regions), whose alignment directions are parallel to and opposite to each other, can be formed in each subpixel. Thus, in order to perform the exposure of the first shot and the exposure of the second shot from different directions, the locations of a light source part and the photo mask may be changed, or the stage may be turned 180 degrees in a horizontal plane. Accordingly, the exposure device in the present embodiment preferably has a stage which is rotatable in a horizontal plane.

Next, as shown in FIG. 2, the first shot and the second shot are also performed in turn for other display regions 27b, 27c, 27d of the substrate in the same manner as in the above-mentioned method. Then, two domains (exposed regions), on which an aligning treatment is performed in the directions parallel to and opposite to each other, are formed in each subpixel of the respective display regions 27b, 27c, 27d. Thereby, exposure (an aligning treatment) for the alignment layer of the TFT array substrate is completed. When exposure regions to the respective display regions 27a, 27b, 27c, 27d are moved, not the light source part and the photo mask but the stage (substrate) is preferably moved. The reason for this is that a long-distance movement of the light source part is not preferable from the viewpoint of stable exposure.

Next, a method of exposing a CF substrate will be described with reference to FIG. 4. FIG. 4 is a schematic perspective view for illustrating an exposure aspect of the CF substrate in the present embodiment, and FIG. 4(a) is a view showing a state before exposure and FIG. 4(b) is a view showing a state of exposing. First, the CF substrate is mounted on a stage of the exposure device. In this time, a light-transmitting area 24 having a width of about half of a subpixel pitch in a direction of a BM 18 formed in a position corresponding to a data signal line (hereinafter, also referred to as a "BM above a data line") is provided in the photo mask 23. As described above, the widths of the light-transmitting area 24 and the light-blocking area 29 may be set at about 255 μm for example, when a 32-inch type display device has a resolution of WXGA (1366×768 pixels) and a display region of 697.6845×392.256 mm. Therefore, a plurality of light-transmitting areas 24 is located in such a way that each pitch of the light-transmitting area is equal to a subpixel pitch in a direction of the BM 18 above a data line. In the present embodiment, since three subpixels composing a pixel are aligned in a direction of a BM 17 formed in a position corresponding to a scanning signal line (hereinafter, also referred to as a "BM above a scanning line"), the pixel pitch in the direction of the BM 18 above a data line becomes equal to the subpixel pitch in the direction of the BM 18 above a data line. Further, a length in the direction of a long side (longitudinal direction) of the light-transmitting area 24 is set at a length longer than that of a display region to be exposed at the time of exposure in a direction parallel to the long side of the light-transmitting area, and it is assumed that in the photo mask 23, the dust 26 adheres to the vicinity of the light-transmitting area 24.

Subsequently, the photo mask 23 is positioned in such a way that each light-transmitting area 24 is aligned along the BM 17 above a scanning line. More specifically, the photo mask 23 is positioned in such a way that one end of a short side of each light-transmitting area 24 is aligned with the BM 17 above a scanning line and one end of a long side of each light-transmitting area 24 is aligned with a perimeter of the display region. Thereafter, a first shot is performed while the photo mask 23 is moved at a constant speed as with the method of exposing a TFT array substrate. Next, the photo mask 23 is horizontally moved by about half of the subpixel pitch in a direction of the BM 18 on a data line to align the light-transmitting area similarly. Thereafter, a second exposure (second shot) is performed for a certain time period for the rest half of a region of each pixel while the photo mask is moved at a constant speed as with the first shot. In this time, the exposure of the second shot is performed from the direction parallel to and opposite to the direction of the first shot. Thereby, two domains, whose alignment directions are parallel to and opposite to each other, can be formed in each subpixel.

Next, the first shot and the second shot are performed similarly for other display regions of the substrate as with the TFT array substrate. Thereby, exposure (an aligning treatment) for the alignment layer of the CF substrate is completed.

Next, a sealing agent is applied to peripheral surface of the exposed display regions of the TFT substrate and the CF substrate. Then, for example, plastic beads of 4 μm in diameter are dispersed on either of substrates and both substrates are bonded to each other. In this time, a relationship between the directions of exposure in both substrates at one subpixel is shown in FIG. 7, and in each domain, the direction of exposure (aligning treatment) in the TFT substrate is perpendicular to the direction of exposure (aligning treatment) in the CF substrate.

Next, after the TFT substrate and the CF substrate are cut between the respective display regions, a liquid crystal molecule (negative nematic liquid crystal material) having negative dielectric anisotropy is filled between the TFT substrate and the CF substrate to form a liquid crystal layer. In this time, the liquid crystal molecules are inclined to different directions among the respective domains and exhibit a pretilt angle to different directions. Since a direction, to which the liquid crystal molecules positioned at the center and near the center of the domain, namely, the liquid crystal molecules positioned at the center and near the center of the layer surface and a thickness direction in the domain are inclined, is inclined at 45 degrees to an exposure direction, if a signal voltage is applied to a completed liquid crystal display panel, the liquid crystal molecules are tilted toward 4 directions orthogonal to one another. The pretilt angle is not particularly limited, but it is preferable to limit the pretilt angle from 85 degrees to less than 90 degrees in the 4 VATN mode from the viewpoint of increasing the transmittance of the liquid crystal display panel.

Next, two polarizers are bonded to the outer surfaces of both substrates in such a way that absorption axes of two polarizers are perpendicular to each other and the absorption axis of one polarizer is parallel to the scanning signal line or the data signal line of the TFT array substrate in viewing the substrate from above. Thereby, when a voltage applied between the substrates is a threshold value or less (off state), since the liquid crystal molecules are aligned substantially perpendicularly to the alignment layer, the liquid crystal display panel can realize good black display. Further, the liquid crystal display panel can exhibit a display characteristic independent of a viewing direction since it has a domain in which liquid crystal molecules respond toward 4 directions.

Thereafter, the step of producing a module is performed by the usual method and thereby a liquid crystal display device in the present embodiment can be completed. Thus, in accordance with the present embodiment, the deterioration of display quality due to the influence of dust on the photo mask can be inhibited because the exposure is performed while the photo mask is moved at a constant speed.

In the present embodiment, an aspect of exposing the alignment layer while the photo mask is moved is mainly described, but it is needless to say that an aspect of exposing the alignment layer while the substrate (stage) is moved achieves a similar effect. However, in this case, it is necessary to set an exposure region increased in size by at least the length of a moving distance of the substrate in a moving direction of the substrate.

In the present embodiment, if exposing the alignment layer while the relative position of the photo mask with respect to the substrate is changed, the alignment layer will be exposed while a position of dust projected onto the substrate is moved. Therefore, in the present embodiment, the exposure may be performed while the photo mask and the substrate are moved together unless the photo mask and the substrate are moved at the same speed in the same direction.

Furthermore, the present embodiment can be also applied to a case where one display region is divided and the divided region is exposed in order to fabricate liquid crystal display devices of very large size such as a 65-inch display. That is, even when the display region formed on the substrate is divided into two or more exposure regions, for example, four regions and the alignment layer is exposed for every region, a substrate of large size can be exposed with inhibiting the deterioration of display quality due to the influence of dust by exposing so as not to produce a gap between the exposure regions in the FIGS. 1 and 2.

Embodiment 2

Hereinafter, Embodiment 2 of the production method of a liquid crystal display device of the present invention will be described. In the present embodiment, since the content is similar to Embodiment 1 except for a method of exposing the substrate, Embodiment 2 will be described with reference to FIG. 3 described in Embodiment 1 and the content overlapping between Embodiments 1 and 2 will be omitted.

A method of exposure in the present embodiment is a method in which the first shot and the second shot in Embodiment 1 are divided into shots of more than once to perform exposure. That is, in the present embodiment, as shown in FIG. 3, the photo mask is positioned relative to the TFT array substrate as with Embodiment 1, and then a first exposure is performed in a state of resting the photo mask and the substrate. The photo mask is moved preferably by 1 mm or longer in the same direction as in Embodiment 1 and then a second exposure is performed for the same domain. Thereafter, a similar exposure is performed for the CF substrate. Thereby, since an unexposed region due to the transfer of dust is not generated, the deterioration of display quality due to the dust can be inhibited.

In the present embodiment, the number of times of division of the exposure (divided into exposures of more than once) may be appropriately set not limited to twice, but if the number of times of movement (number of divided exposures) is increased, the influence of the transfer of dust can be more mitigated, and it is preferable that the number of times of exposure and movement is as large as possible. For example, when the first shot is divided into shots of ten times to perform the exposure, since an exposure amount in a region (region of low exposure), to which the dust is transferred and in which an exposure amount is small, becomes 90% of an exposure amount in a normal region, the display quality is not particularly affected.

In the present embodiment, the photo mask may be moved in a direction which is not approximately parallel to but approximately perpendicular to the direction of a long side (longitudinal direction) of the light-transmitting area, and then the second shot may be performed. However, in this case, it is preferable to increase the number of light-transmitting areas to be formed in accordance with a moving distance of the photo mask. Specifically, if the photo mask is moved by subpixel pitch in one direction perpendicular to the direction of a long side of the light-transmitting area and is ultimately shifted the N (N: natural number) subpixel pitches, it is preferable to locate the light-transmitting areas more than number of the subpixels in a range of the moving direction of the photo mask by at least N. Thereby, the exposure can be divided in such a manner that the light-transmitting areas are continuous in a display region to be exposed. In the present embodiment, the photo mask may be moved in a slanting direction relative to the direction of a long side (longitudinal direction) of the light-transmitting area, and then the second shot may be performed. However, also in this case, it is preferable to increase the number of light-transmitting areas and lengthen the length of the direction of a long side (longitudinal direction) of the light-transmitting area in accordance with a moving distance of the photo mask. In the photo mask of the present embodiment, as described above, a size of a region on the side opposite to a moving direction, in which the light-transmitting area is located, is preferably larger than a size of a display region to be exposed at the time of exposure.

Embodiment 3

Hereinafter, Embodiment 3 of the production method of a liquid crystal display device of the present invention will be described with reference to FIG. 8. FIG. 8 is a schematic perspective view for illustrating an exposure aspect of the TFT array substrate in the present embodiment, and FIG. 8(*a*) is a view showing an exposure aspect in the first shot and FIG. 8(*b*) is a view showing an exposure aspect in the second shot. In the present embodiment, since the content is similar to Embodiment 1 except for a method of exposing the substrate, the content overlapping between Embodiments 1 and 3 will be omitted. Further, a member having the same form as in Embodiment 1 is denoted by the same reference numeral.

A method of exposing a substrate in the present embodiment will be described. First, the photomask is positioned relative to the TFT array substrate as with Embodiment 1, and then as shown in FIG. 8(*a*), the first shot is performed in a state of resting the photo mask and the substrate to form one domain. In this time, an unexposed region 30 is generated in the subpixel 32A due to the influence of the transfer of the dust 26 adhering to the vicinity of the light-transmitting area 24 of the photo mask.

Next, as shown in FIG. 8(*b*), the photo mask is moved by the (N+0.5) subpixel pitches in a direction approximately perpendicular to the direction of a long side (longitudinal direction) of the light-transmitting area. Thereafter, by performing the second shot for an unexposed region of the subpixel, exposure (an aligning treatment) for the substrate is completed. In this time, an unexposed region 30 is generated in the subpixel 32B due to the influence of the transfer of the dust adhering to the photo mask.

As described above, in the present embodiment, the unexposed region is generated by the influence of dust. However, since the dust is moved by the (N+0.5) subpixel pitches by moving the photo mask by the (N+0.5) subpixel pitches, the generation of the unexposed region in the same subpixel can be inhibited. Accordingly, the present embodiment can minimally inhibit the influence of the unexposed area.

In the photo mask of the present embodiment, as with Embodiment 2, a size of a region on the side opposite to a moving direction, in which the light-transmitting area is located, is preferably larger than a size of a display region to be exposed at the time of exposure. More specifically, in the present embodiment, in order to shift the photo mask by the (0.5+N) subpixel pitches, it is preferable that number of the light-transmitting areas of the photo mask be more than the number of the subpixels located in an exposure region in a moving direction of the photo mask by at least N. Here, a case where the photo mask is moved right (wherein the term right indicates a right direction in a drawing of FIG. 8) relative to the substrate will be described as an example. Preferably, in the 1st shot, the light-transmitting area at the far left (wherein the term left indicates a left direction in a drawing of FIG. 8) of the photo mask is not aligned with a left half of the subpixel at the far left of a region to be exposed, but in the 1st shot, the left half of the subpixel at the far left of the region to be exposed is exposed using a light-transmitting area of the photo mask which is a N-th light-transmitting area or more from the far left of the photo mask so that when the photo mask is moved by (N+0.5) subpixel pitches in the 2nd shot, the light-transmitting area of the photo mask is also aligned with a right half of the subpixel at the far left of the region to be exposed. Furthermore, in the present embodiment, the photo mask may be moved diagonally relative to the direction of a long side (longitudinal direction) of the light-transmitting area so as to move by (N+0.5) subpixel pitches to a direction approximately perpendicular to the direction of a long side (longitudinal direction) of the light-transmitting area and then the 2nd shot may be carried out.

In the present embodiment, a value of N is not particularly limited, but the value of N is preferably larger since unexposed regions are further away from each other. Further, generally, one subpixel is a pixel of any one color of red (R), green (G) and blue (B), and one pixel is composed of three colors of R, G and B. Accordingly, in the case of color display, the value of N is preferably 3 or more so that a plurality of unexposed regions does not exist in the same pixel.

With reference to Table 2, the number of pixels contained in a range of the moving distance of the photo mask or the substrate in the present embodiment will be described. Table 2 is a table showing a distance in moving the photo mask or the substrate by (0.5+N) subpixel pitches (N=3, 10, 20). As shown in Table 2, in each case, if the moving distance of the photo mask (substrate) is 0.5 mm or longer, the photo mask or the substrate is moved by 3 pitches or longer of the subpixel, that is, 1 pixel pitch or longer. Therefore, it is understood that the relative position of the photo mask with respect to the substrate is preferably moved by 0.5 mm or longer in the present embodiment.

TABLE 2

| Size | Format | The number of pixels | Display area (mm) | Sub pixel size R (or B, G) (mm) | Moving distance of mask (N + 0.5) of sub pixel (mm) | | |
|---|---|---|---|---|---|---|---|
| | | | | | N = 3 | N = 10 | N = 20 |
| 32" | WXGA | 1366 × 768 | 697.6845 × 392.256 | 0.17 | 0.60 | 1.79 | 3.49 |
| 37" | WXGA | 1366 × 768 | 819.6 × 460.8 | 0.20 | 0.70 | 2.10 | 4.10 |
| 37" | HDTV | 1920 × 1080 | 819.6 × 460.8 | 0.14 | 0.50 | 1.49 | 2.92 |
| 45" | HDTV | 1920 × 1080 | 985.92 × 554.58 | 0.17 | 0.60 | 1.80 | 3.51 |
| 65" | HDTV | 1920 × 1080 | 1428.4 × 803.52 | 0.25 | 0.87 | 2.60 | 5.08 |

In the present invention, the distance by which the photo mask or the substrate is moved may be 1 pitch or longer of the pixel and can be set in accordance with a desired domain design. Therefore, the present embodiment may be an exposure aspect in which for example, using a photo mask whose light-transmitting area and light-blocking area have a width of about a quarter of the subpixel pitch, respectively, the first shot is performed and then the photo mask is moved by the (N+0.25) subpixel pitches and the second shot is performed.

This application claims priority based on the Paris Convention or laws in a country where application is translated based on Japanese patent application number 2006-124426 filed on Apr. 27, 2006. The content of the application is herein incorporated by reference in its entirety.

BRIEF DESCRIPTIONS OF THE DRAWINGS

FIG. 3(a) is a view showing a state before exposure and FIG. 3(b) is a view showing a state of exposing.

FIG. 4(a) is a view showing a state before exposure and FIG. 4(b) is a view showing a state of exposing.

Figure 1:
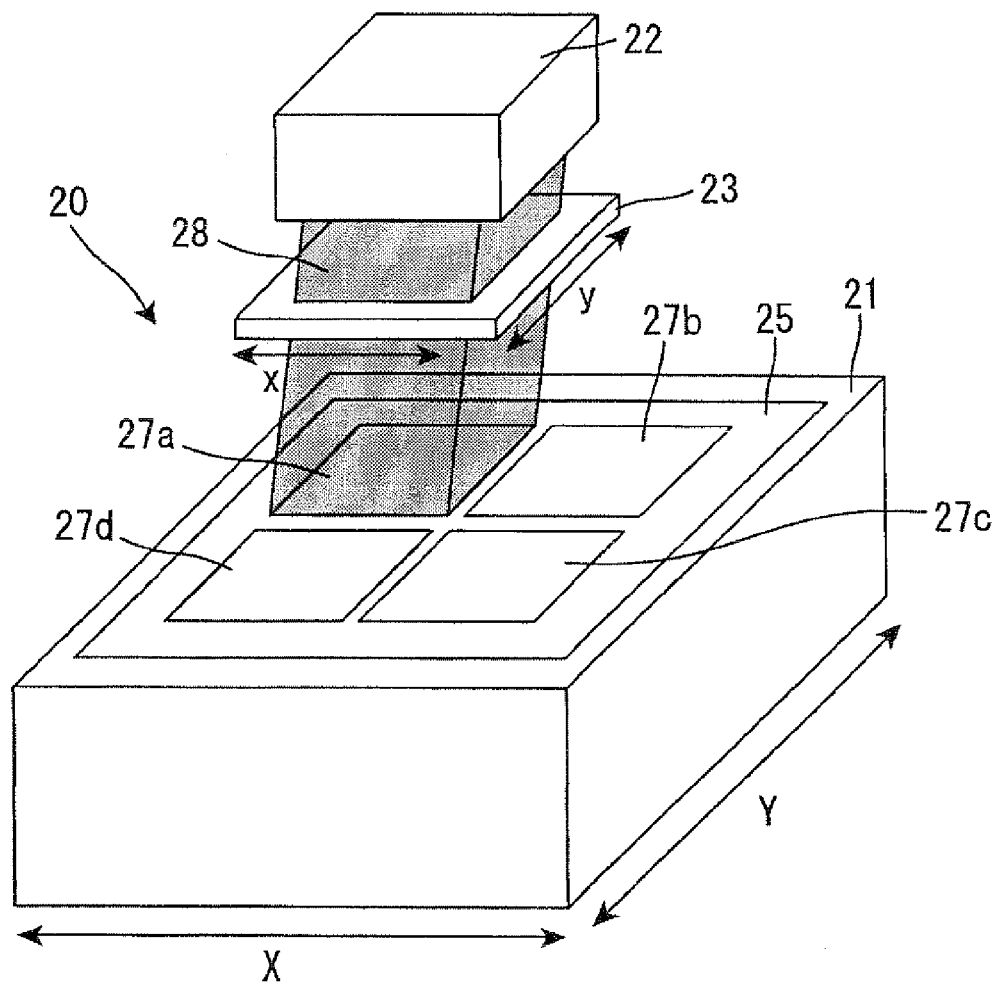
FIG. 1 is a schematic perspective view of an exposure device in Embodiment 1.
Figure 2:
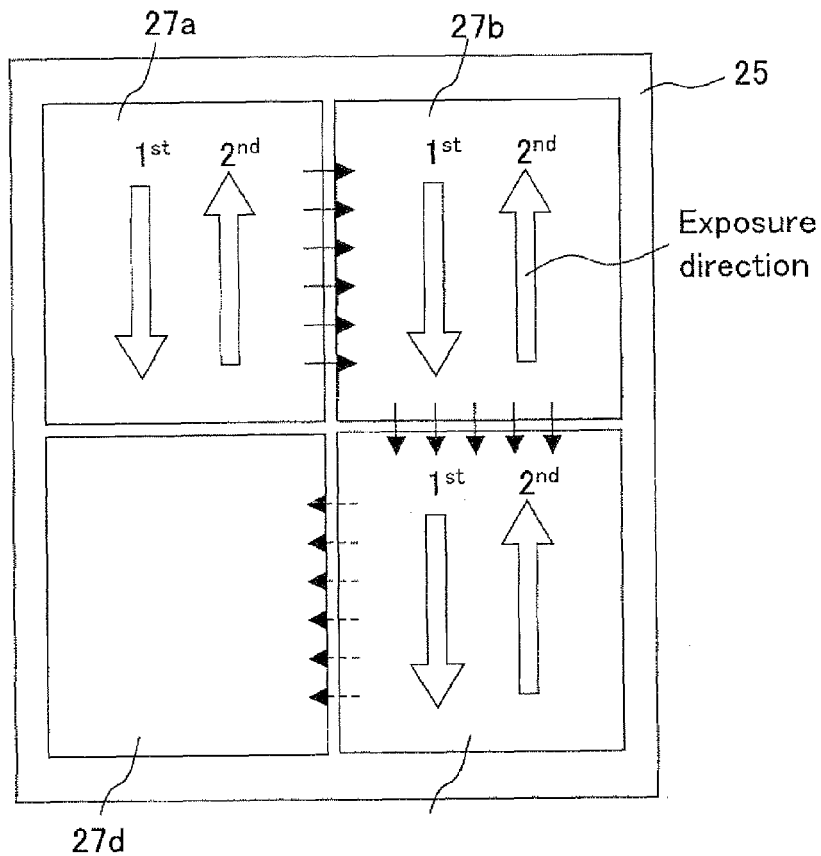
FIG. 2 is a schematic plan view of a substrate in Embodiment 1.
Figure 3:
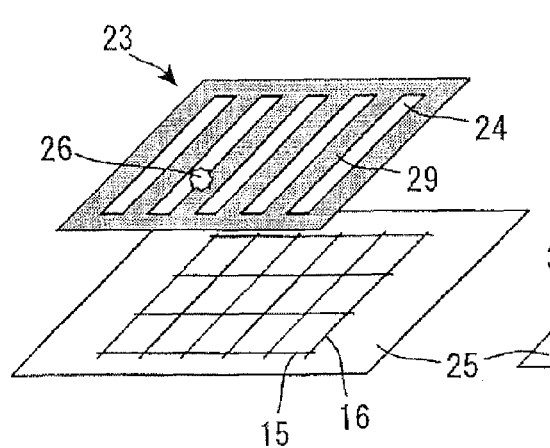
FIG. 3 is a schematic perspective view for illustrating an exposure aspect of a TFT array substrate in Embodiment 1.
Figure 3:
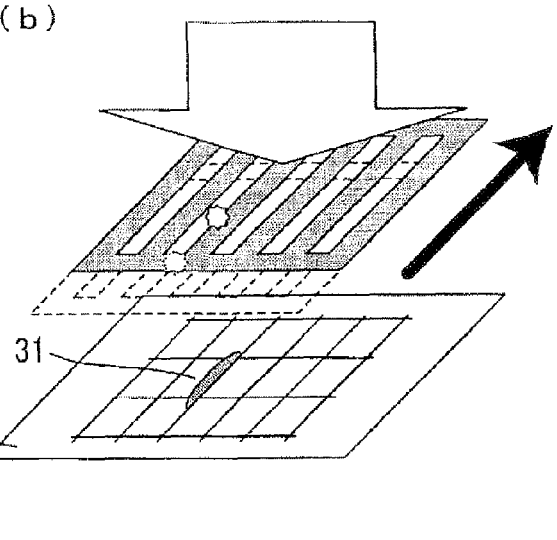
Figure 4:
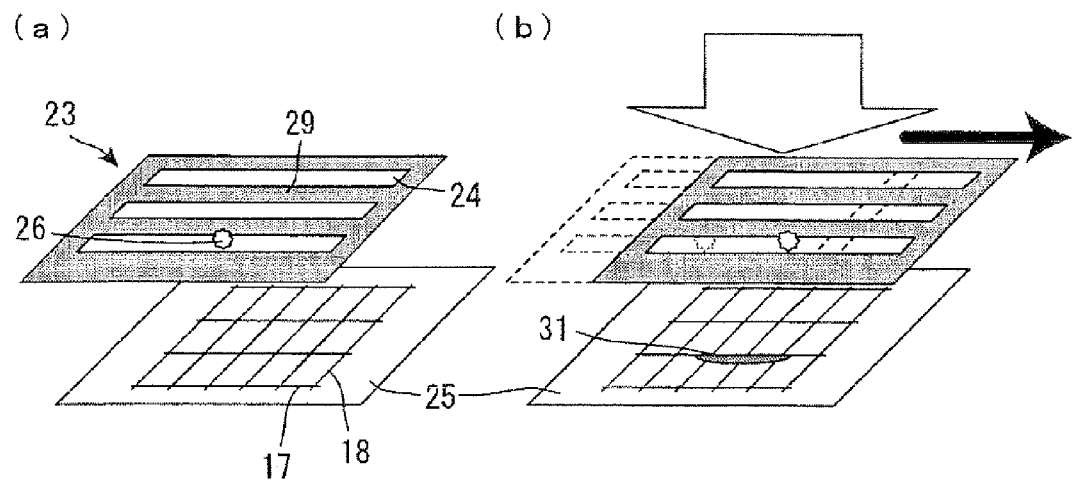
FIG. 4 is a schematic perspective view for illustrating an exposure aspect of a CF substrate in Embodiment 1.
Figure 5:
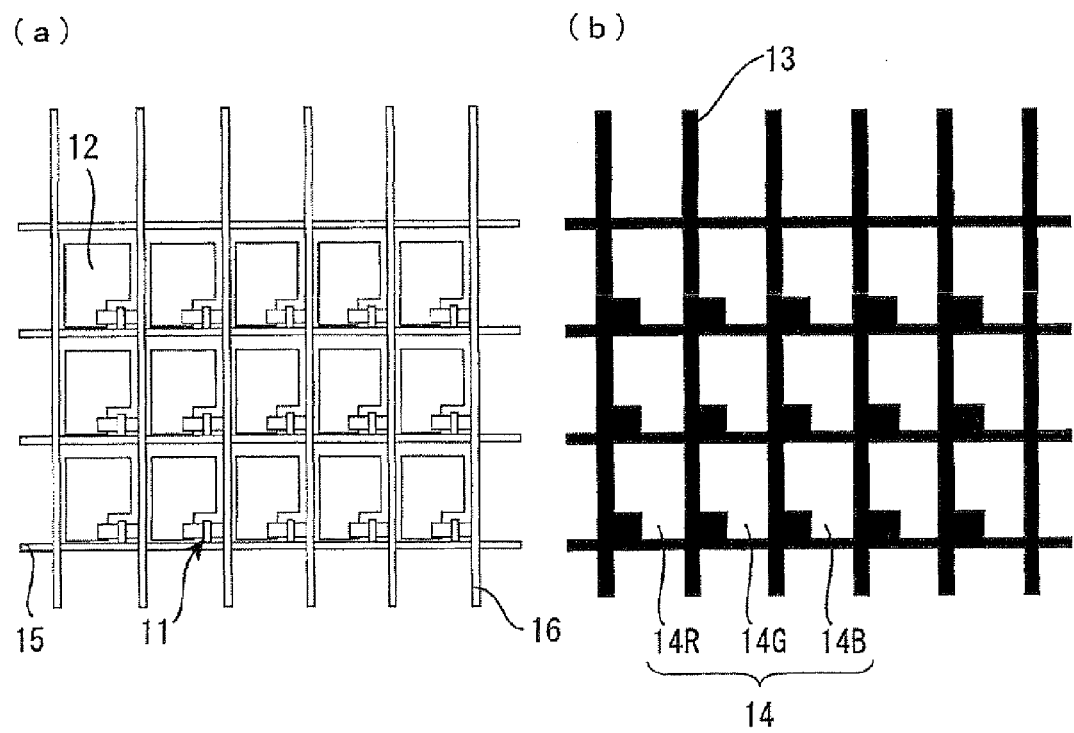
FIG. 5(a) is a schematic plan view of the TFT array substrate in Embodiment 1 and FIG. 5(b) is a schematic plan view of the CF substrate in Embodiment 1.
Figure 6:
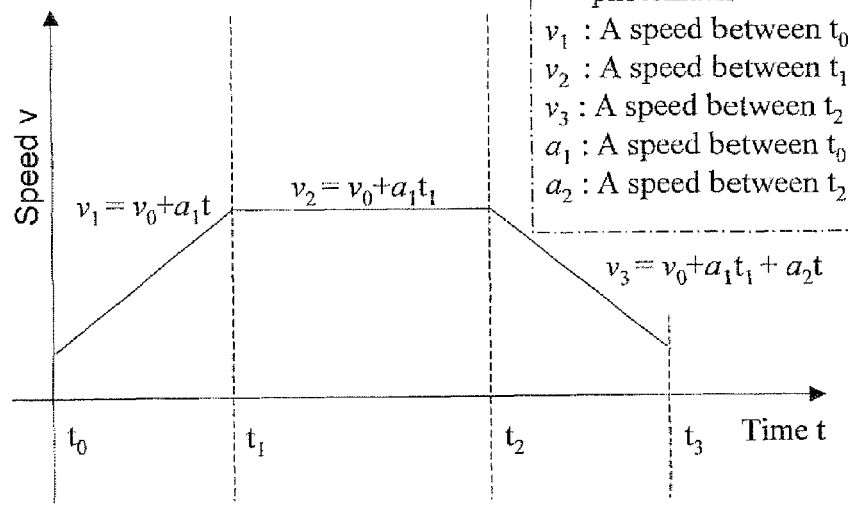
Figure 6:
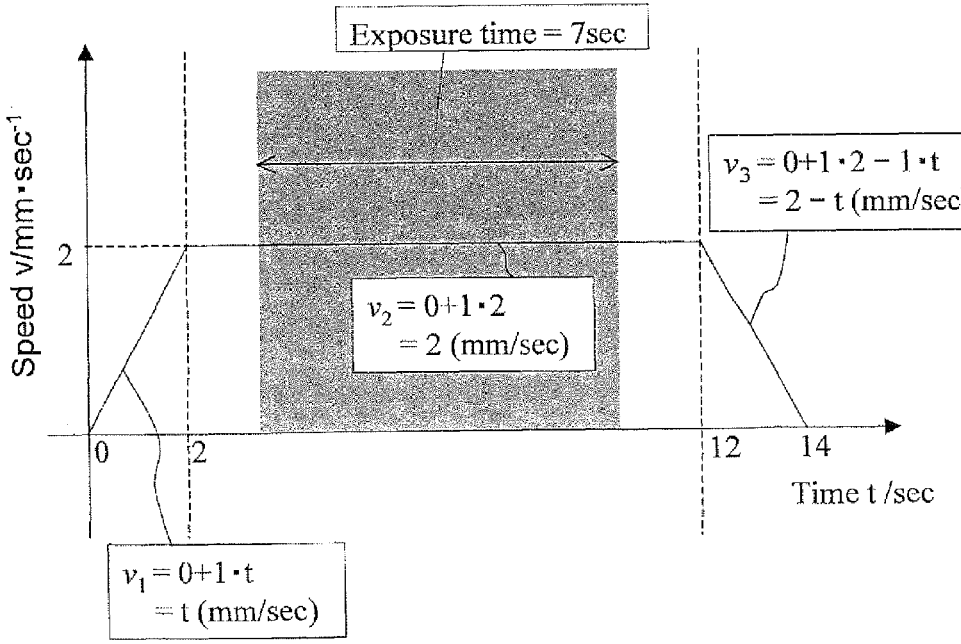

FIGS. 6(a) and 6(b) are conceptual views showing a change in the moving speed with time of a photo mask or a stage in Embodiment 1.

Figure 7:
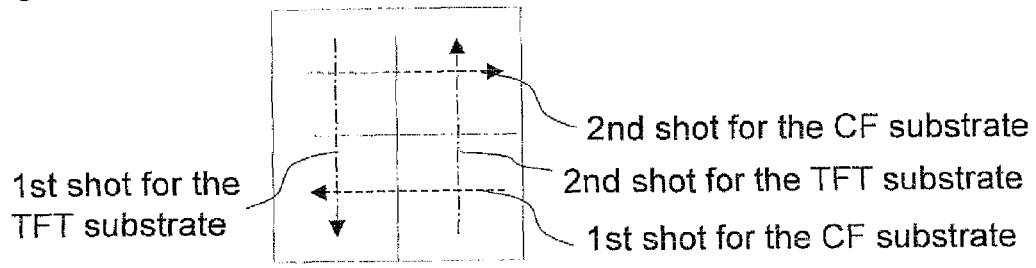

FIG. 7 is a conceptual view showing a relationship between four domains and directions of exposure in a subpixel in Embodiment 1.

Figure 8:
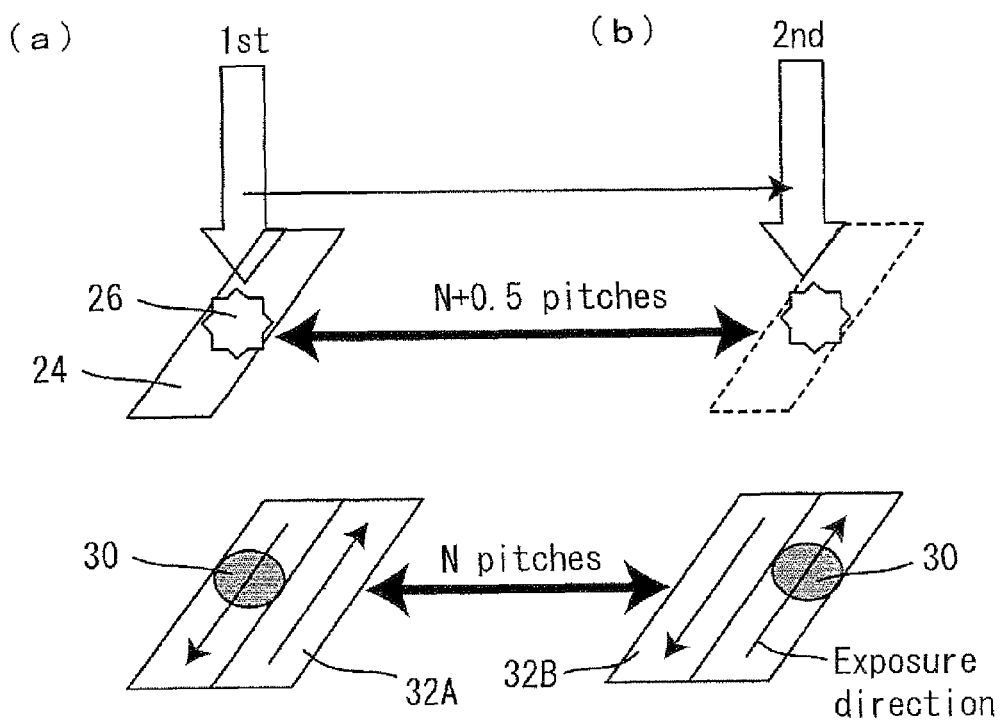

FIG. 8 is a schematic perspective view for illustrating an exposure aspect of a TFT array substrate in Embodiment 3, and FIG. 8(a) is a view showing an exposure aspect in the first shot and FIG. 8(b) is a view showing an exposure aspect in the second shot.

Figure 9:
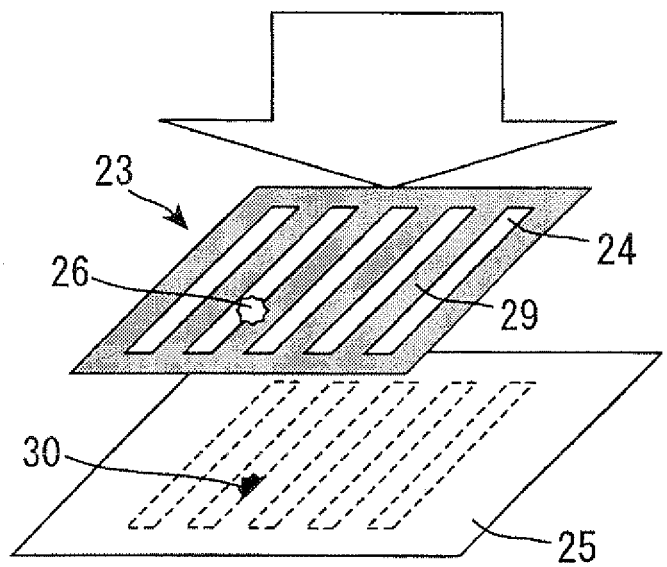

FIG. 9 is a schematic perspective view for illustrating an exposure aspect of a substrate by a conventional method.

Figure 10:
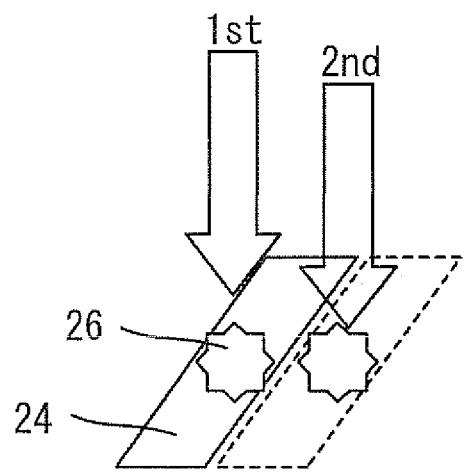
Figure 10:
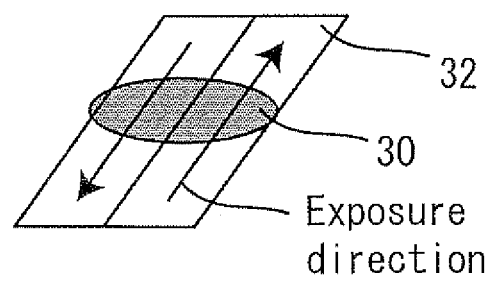

FIG. 10 is a schematic perspective view for illustrating an exposure aspect of a substrate by another conventional method.

EXPLANATION OF SYMBOLS

11: TFT
12: pixel electrode
13: black matrix (BM)
14: color filter
14R: red (R) filter
14G: green (G) filter
14B: blue (B) filter
15: scanning signal line
16: data signal line
17: BM above a scanning line
18: BM above a data line
20: exposure device
21: stage
22: light source part
23: photo mask
24: light-transmitting area
25: substrate
26: dust
27a, 27b, 27c, 27d: display region
28: parallel rays
29: light-blocking area
30: unexposed region
31: region of a low exposure
32: pixel
32A, 32B: subpixel

The invention claimed is:

1. A production method for a liquid crystal display device in which an alignment layer is provided on a substrate and two or more domains are formed in each of a plurality of pixels in a display region by exposing the alignment layer, comprising:
wherein the production method includes an exposure step of exposing the alignment layer through a photo mask in which a plurality of light-transmitting areas are located in a stripe pattern,
wherein the exposure step is a step of exposing the alignment layer continuously while a relative position of the photo mask with respect to the substrate at the time of viewing a substrate surface from the front is moved in a longitudinal direction of the light-transmitting areas, and
wherein in the photo mask, a length in the longitudinal direction of the light-transmitting area is longer than a length of a display region to be exposed at the time of exposure in a direction parallel to the longitudinal direction of the light-transmitting area.

2. The production method according to claim 1, wherein the exposure step is a step of exposing the alignment layer while the relative position of the photo mask with respect to the substrate is moved in one direction.

3. The production method according to claim 1, wherein in the exposure step, the alignment layer is exposed while the photo mask and/or the substrate are/is moved at a constant speed.

4. The production method according to claim 1, wherein in the exposure step, the display region is divided into two or more exposure regions and the alignment layer in each of the two or more exposure regions is exposed through the photo mask.

5. The production method according to claim 1, wherein the production method comprising the steps of:
forming two domains partitioned in a stripe pattern in the pixel of the display region by exposing the alignment layer twice in each pixel in directions parallel to and opposite to each other over a plurality of the pixels in one substrate through a photo mask, the photo mask including the plurality of light-transmitting areas located in a stripe pattern;
forming two domains partitioned in a stripe pattern in the pixel of the display region by exposing the alignment layer twice in each pixel in directions parallel to and opposite to each other over a plurality of the pixels in the other substrate through a photo mask, the photo mask including the plurality of light-transmitting areas located in a stripe pattern;
bonding the one substrate to the other substrate in such a way that the direction of exposure for the one substrate is perpendicular to the direction of exposure for the other substrate and the alignment layer on the one substrate faces the alignment layer on the other substrate; and
injecting liquid crystal molecules having negative dielectric anisotropy between the substrates,
wherein the liquid crystal molecules are aligned substantially perpendicularly to surfaces of the alignment layers when a voltage less than a threshold value is applied between the substrates.

6. The production method according to claim 1, wherein the liquid crystal display device includes a pair of substrates and a liquid crystal layer arranged between the substrates,
the liquid crystal layer contains liquid crystal molecules having negative dielectric anisotropy,
the alignment layers are each provided on a surface on the liquid crystal layer side of each the pair of substrates, and the liquid crystal molecules are aligned substantially perpendicularly to surfaces of the alignment layers when a voltage less than a threshold value is applied between the substrates, and the liquid crystal display device has four domains, and in the four domains, alignment directions of the liquid crystal molecules near the alignment layer provided on one substrate is perpendicularly to alignment directions of the liquid crystal molecules near the alignment layer provided on the other substrate at the time of viewing a substrate surface from the front, and when a voltage less than a threshold value is applied between the pair of substrates, alignment directions of the liquid crystal molecules at the center and near the center of the liquid crystal layer are different in such a way that the alignment directions are perpendicular to each other.

* * * * *